United States Patent [19]

Hull

[11] Patent Number: 5,241,213
[45] Date of Patent: Aug. 31, 1993

[54] BURIED ZENER DIODE HAVING AUXILIARY ZENER JUNCTION ACCESS PATH

[75] Inventor: Richard Hull, Palm Bay, Fla.

[73] Assignee: Harris Corporation, Melbourne, Fla.

[21] Appl. No.: 739,133

[22] Filed: Jul. 30, 1991

[51] Int. Cl.$^5$ .......................................... H01L 29/90
[52] U.S. Cl. .................................... 257/606; 257/551
[58] Field of Search ................ 357/13, 13 LM, 13 Z, 357/20, 23.13; 257/606, 603, 605, 551

[56] References Cited

U.S. PATENT DOCUMENTS

| | | | |
|---|---|---|---|
| 4,451,839 | 5/1984 | Nelson | 257/605 |
| 4,646,114 | 2/1987 | Vinn et al. | 257/551 |
| 4,910,158 | 3/1990 | Anderson | 357/13 |
| 5,055,902 | 10/1991 | Lambert | 357/13 |

FOREIGN PATENT DOCUMENTS

| | | | |
|---|---|---|---|
| 0314399 | 5/1989 | European Pat. Off. | 357/13 |
| 60-260162 | 12/1985 | Japan | 357/13 |
| 2-216873 | 8/1990 | Japan | 357/13 |

*Primary Examiner*—Andrew J. James
*Assistant Examiner*—Courtney A. Bowers
*Attorney, Agent, or Firm*—Evenson, Wands, Edwards, Lenahan & McKeown

[57] ABSTRACT

A buried Zener diode has an auxiliary Zener junction access path in parallel with the force anode/cathode path. Unlike the force anode/cathode path, the auxiliary path is effectively by-passed by the current flowing between the force anode and cathode during circuit operation, so that there is no accumulation of significant resistance-current products that would otherwise mask the Zener voltage. The Zener diode has an anode region disposed in a first surface portion of a substrate. A 'force' anode is formed on a first surface portion of the anode region. A 'sense' anode is disposed on a second surface portion of the anode region spaced apart from the force anode. A first cathode region is disposed in a second surface portion of the substrate spaced apart from the anode region, while a sense cathode region is disposed in a third surface portion of the substrate spaced apart from each of the anode region and the first cathode region. A 'force' cathode is disposed on the first cathode region and a 'sense' cathode is disposed on the sense cathode region. A first N-type region is buried beneath and contiguous with the force cathode region and a second N-type region is buried beneath and contiguous with the sense cathode region. A third N-type region is buried beneath and contiguous with the force anode region. This third buried region has a first portion which defines a buried Zener junction with the anode region and extends to and is contiguous with the first buried region. A portion of the third provides a by-pass path to enable Zener voltage to be measured absent voltage drops of the main current flow path.

13 Claims, 4 Drawing Sheets

BURIED ZENER DIODE HAVING AUXILIARY ZENER JUNCTION ACCESS PATH

FIELD OF THE INVENTION

The present invention relates to semiconductor devices and is particularly directed to an improved buried Zener diode architecture having an auxiliary Zener junction access path which permits the Zener voltage to be accurately measured without being adversely influenced by voltage drops through the customary anode/cathode current flow path.

BACKGROUND OF THE INVENTION

FIG. 1 diagrammatically illustrates, in cross-section, the configuration of a conventional buried Zener diode device 10 formed, for example, in a dielectrically isolated island region 12 of a semiconductor support substrate 14. (Typically, the topology of the Zener diode device is circular or conical so that the respective regions and surface contacts are generally conically or circularly shaped and are axially symmetrical with respect to an axis 16 that is orthogonal to the top surface 18 of the substrate.)

In particular, the device itself is shown as comprising a semiconductor island region 21 of lightly doped semiconductor material, such as P-type silicon, in a generally centrally located top surface portion of which a surface anode region 23 of heavily doped P− semiconductor material is formed. Surface anode region 23 has an generally annular or ring-shaped surface conductor 25 which provides the anode contact to the device. Adjacent to, but spaced apart from anode region 23 is an annular shaped deep N-type cathode region 31 which extends from surface 18 through island region 21 to an N+ underlying or buried region 33 at the bottom of the dielectrically isolated island. A Zener junction 34 is formed by a center column N-type region 35, which adjoins a portion of the bottom of anode region 23 and buried region 33. Annular shaped surface cathode region 31 has an generally annular or ring-shaped surface conductor 37 which provides the cathode contact to the device.

In a typical application as a voltage reference device, the anode and cathode terminals 25/37 of the Zener diode are coupled to a voltage monitoring circuit, which uses the Zener junction voltage for a specified control function. Because the voltage reference path to the Zener junction traverses a multiple region path through which current flows between the anode and cathode, what is measured by way of the anode and cathode contacts is necessarily inclusive of an accumulation of voltage drops across a serial resistance path through the device regions. The resistances of such regions which give rise to this series of voltage drops are schematically identified in FIG. 1 by resistance symbology associated with the respective regions and provided with same reference numerals as the regions, superseded by the letter R. For the cylindrically symmetric configuration shown, accordingly, there is a summed resistance value of (R31+R33+R35+R23) in series with the Zener junction voltage between any two anode/cathode contact points. Namely, the resistance R23 of the P+ semiconductor material of anode region 23 effectively masks the voltage at the true anode, while the accumulated value cf resistances R31+R33+R35 of the N type semiconductor material of regions 31, 33 and 35 effectively masks the voltage at the true cathode 36.

Although the individual resistances may be relatively small (e.g. on the order of 5–15 ohms), their values can vary widely due to variations in processing parameters or as a result of no control of sheet resistance during wafer processing, so that the total resistance of these regions may vary over a substantial range. This, coupled with differences in temperature coefficients, effectively prevents precision monitoring of the Zener junction voltage.

SUMMARY OF THE INVENTION

In accordance with the present invention, the unwanted influence of such series resistance voltage drops is effectively obviated by means of a new and improved buried Zener diode architecture having an auxiliary Zener junction access path in parallel with the main or 'force' anode/cathode path through which current customarily flows during operation of the device. However, unlike the main anode/cathode path, the auxiliary path is effectively by-passed by the current flowing between the main anode and cathode terminals during circuit operation, so that there is no accumulation of significant resistance-current products that would otherwise mask the Zener voltage.

More particularly, the improved Zener diode architecture of the present invention comprises a semiconductor substrate having an anode semiconductor region disposed in a first surface portion of the substrate. A generally annular main or 'force' anode contact is formed on a first surface portion of the anode region. A second, 'sense' anode contact is disposed on a second surface portion of the anode region surrounded by and spaced apart from the main anode electrode, so that there is a ring-shaped portion of the anode semiconductor region between the force and sense anode contacts.

A first cathode semiconductor region is disposed in a second surface portion of the substrate, which generally surrounds and is spaced apart from the anode region, while a second cathode region is disposed in a third surface portion of the substrate spaced apart from each of the anode region and the first cathode region. A first generally annular main or 'force' cathode electrode is disposed on the first cathode region and a second or 'sense' cathode electrode is disposed on the second cathode region.

A first buried N-type semiconductor region is disposed in the substrate beneath and contiguous with the first cathode region and a second buried N-type semiconductor region is disposed in the substrate beneath and contiguous with the second cathode region. A third N-type semiconductor region is disposed in the substrate beneath and contiguous with the first anode region. This third buried N-type region has a first, generally annular portion which defines a buried Zener junction with the first anode semiconductor region and extends to and is contiguous with the first buried N-type semiconductor region, such that the projection of the second anode is effectively surrounded by this first portion of the third buried N-type region. The diameter of the first annular portion of the third N-type buried region is less than that of the force anode, so that a first part of the above-referenced ring-shaped portion of the anode region lies between the sense anode and the Zener junction and a second part lies between the force anode and the Zener junction. As a result, the first part of the ring-shaped portion of the anode region is not traversed by a current flow path between the force anode and the Zener junction.

The third buried N-type region also has a second, spaced apart portion that extends from the annular, Zener junction portion of the third N-type buried region and is contiguous with the second buried N-type semiconductor region. Since the semiconductor material of the second portion of the third buried region, the second buried region and the sense cathode region occupies a portion of the Zener diode device that is spaced apart from the force cathode region and first buried N-type region, it will not be traversed by the current flow path from the Zener junction to the force cathode.

In operation, as in the prior art Zener diode device of FIG. 1 discussed previously, a typical application of the device as a voltage reference has the force anode and the force cathode contacts coupled in a current flow path of a circuit, the operation of which is based upon the Zener junction voltage for initiating a specified control function. However, unlike the conventional device, the Zener voltage is not monitored by way of current flow path through the device between the force anode and cathode contacts. Instead, the Zener voltage is monitored by the auxiliary 'sense' anode and cathode terminals. Because of the device architecture and the location of these 'sense' electrodes relative to the force anode and force cathode contacts, the monitoring path from the sense anode and sense cathode contacts to the Zener junction encounters no current flow path that coincides with the current flow path between the force anode and force cathode contacts. Consequently, connection of a high impedance sensing circuit, such as an operational amplifier as a Zener voltage monitoring device, to the sense and cathode contacts will not cause an appreciable current flow through regions of the Zener diode, so that there is no significant cumulative voltage drop across such regions. Thus, the Zener voltage may be monitored very precisely, regardless of accumulated voltage drops through the regions that lie in a circuit path between the force anode and force cathode contacts. Namely, even where the values of resistances of regions in the by-pass path between the sense anode and sense cathode contacts become quite large, (e.g. on the order of 15000–30000 ohms), or vary widely, so that the total resistance of these by-pass regions may vary over a substantial range, their effect on the Zener voltage measurement by way of the sense electrodes is insignificant.

DETAILED DESCRIPTION

Figure 2:
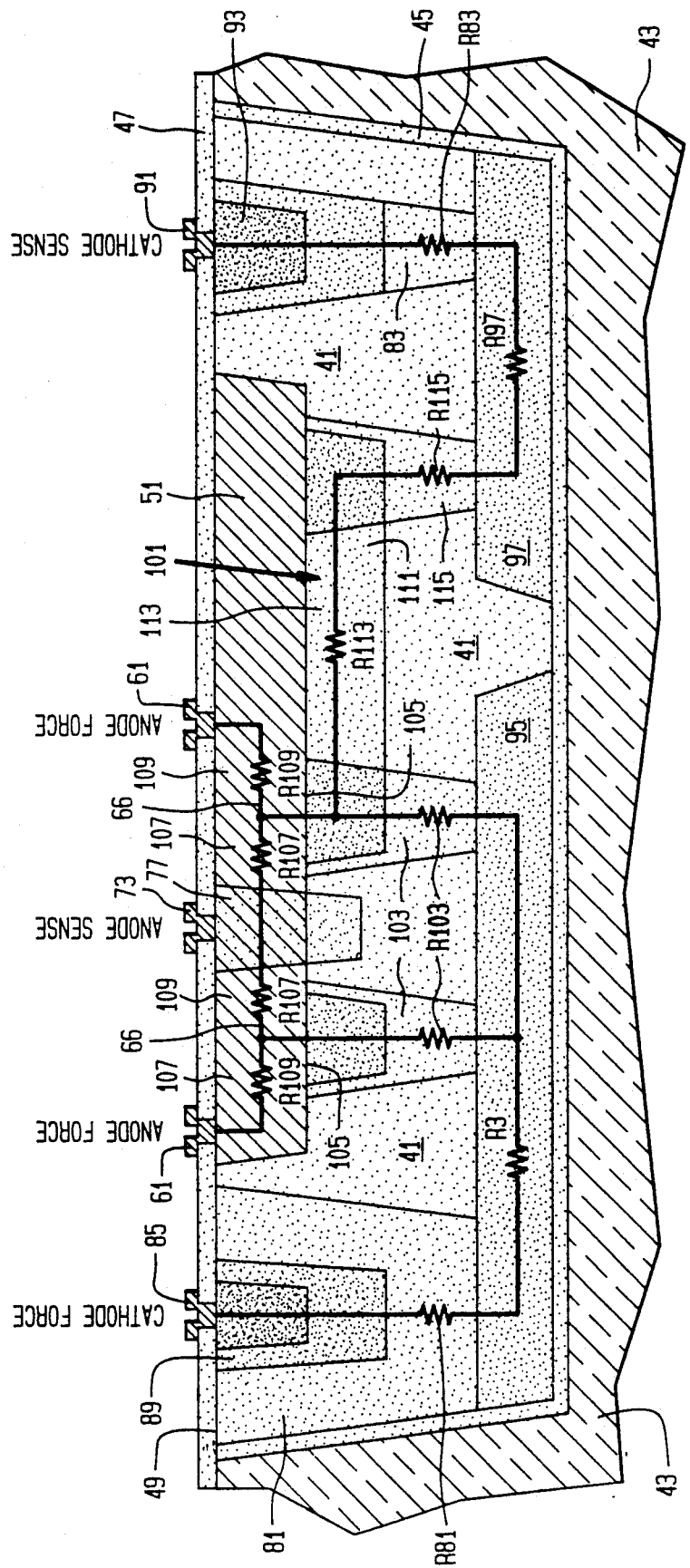
FIG. 2 diagrammatically illustrates, in cross-section (along section X—X of FIG. 3), the configuration of a buried Zener diode device formed in a dielectrically isolated island region of a semiconductor support substrate in accordance with a preferred embodiment of the present invention.
Figure 3:
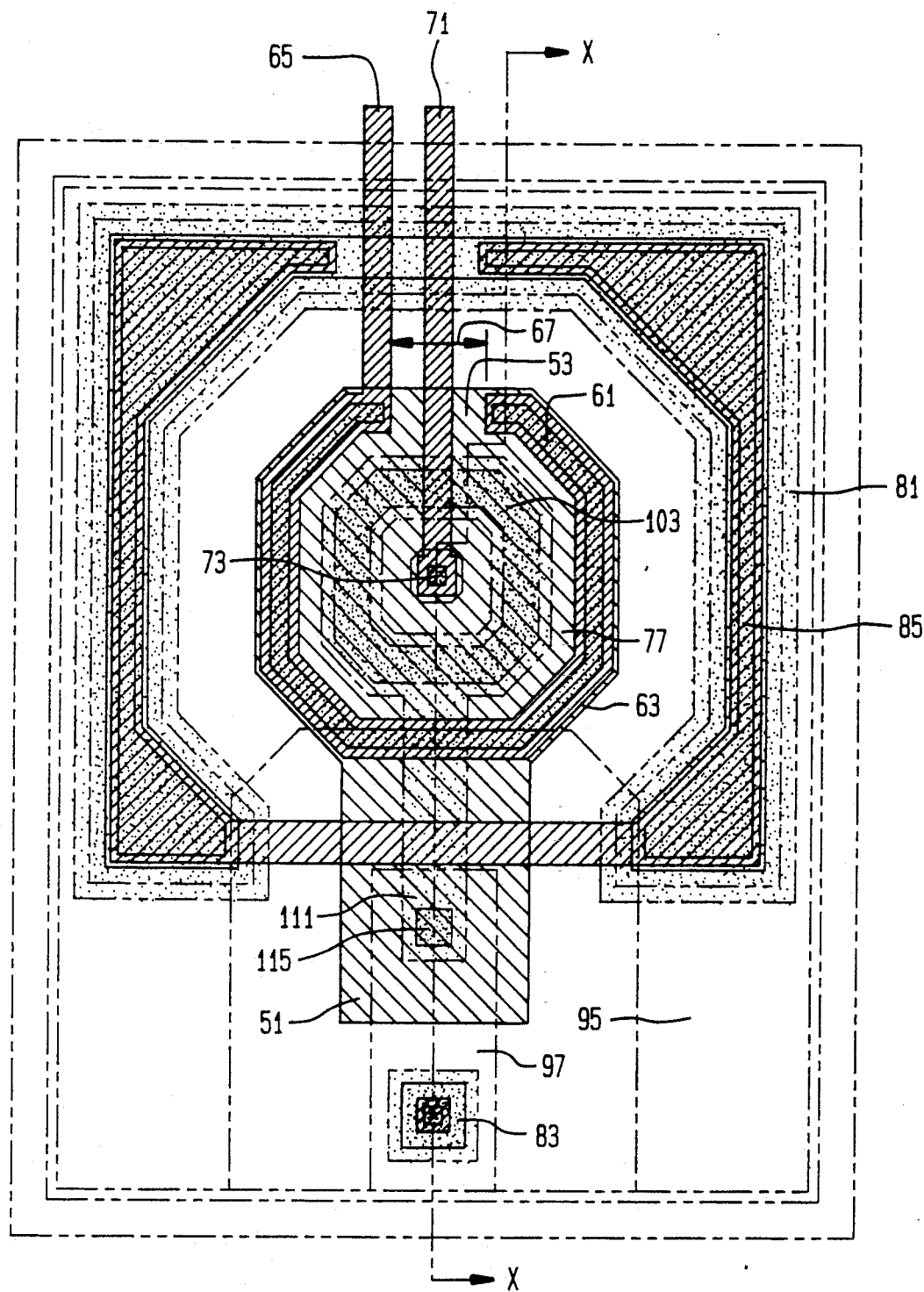
FIG. 3 is a diagrammatic plan view of the buried Zener diode device of FIG. 2.

Referring now to FIGS. 2 and 3, the semiconductor architecture of a preferred embodiment of a buried Zener diode device in accordance with the present invention is diagrammatically illustrated as part of an integrated circuit supported by or resident within a dielectrically isolated (DI) island or pocket region 41 of a semiconductor substrate 43. It should be observed, however, that the environment of a DI island of an integrated circuit-supporting substrate is merely one non-limitative example of the structure in which the device may be formed. The invention may also be incorporated in other semiconductor circuit architectures, such as discrete devices, for example. Moreover, it is to be understood that manufacture of the Zener diode architecture of the present invention preferably uses conventional wafer processing techniques, including ion implantation and drive in steps, with selectively masked counter-doping, to delineate the geometry and depth of the respective regions of the device.

The buried Zener diode device itself is shown as comprising a semiconductor island region or pocket 41 of lightly doped P-type silicon, insulated from support substrate 43 by a dielectric (oxide insulation) layer 45. A passivating dielectric layer 47 overlies the top surface 49 of substrate 43. As shown topologically in the plan view of FIG. 3, a heavily doped P+ semiconductor anode region 51 having a first, large diameter, generally octagonal portion 53 and an adjoining rectilinear portion 55 is disposed in a first surface portion of island region 41. A somewhat octagonal, annular-shaped main or 'force' anode contact 61 is formed on the surface of and adjacent to the corresponding octagonal perimeter 63 of the generally octagonal portion 53 of anode region 51. Force anode contact 61 has an interconnect portion 65 shown in FIG. 3 as overlying oxide layer 47 for connection to another circuit within the substrate.

Force anode contact 61 has an opening or slot 67 at one end thereof through which an interconnect layer 71 overlying passivating oxide layer 47 extends to a second, 'sense' anode contact 73 disposed on a second surface portion of anode region 51, in which a P+ sense anode ohmic contact region 75 is formed. As shown in FIG. 3, 'sense' anode contact 73 and P+ anode ohmic contact region 75 therebeneath are generally surrounded by and spaced apart from force anode contact 61 electrode, so that there is a ring-shaped portion 77 of anode region 51 between the force anode contact 61 and sense anode contact 73. Sense anode P+ ohmic contact region 75 extends completely through anode region 51 and may partially extend into P− island region therebeneath, as shown in FIG. 2.

A first, generally annular-shaped, larger diameter, deep N+ cathode semiconductor region 81 is disposed in a second surface portion of island region 41, which generally surrounds and is spaced apart from anode region 51, while a second deep N+ cathode region 83 is disposed in a third surface portion of island region 41 spaced apart from each of anode region 51 and the first cathode region 81. A first, generally U-shaped main or 'force' cathode contact 85 electrode having a generally octagonally shaped interior edge 87 is disposed on an N+ ohmic contact region 89 within the top surface of first cathode region 81. A second or 'sense' cathode contact 91 is disposed on an N+ ohmic contact region 93 of second cathode region 83. Each of deep N+ cathode regions 81 and 83 extends through island region 41 and adjoins a respective buried N+ region disposed at the bottom of the island region.

Specifically, a first N+ semiconductor region 95, the shape of which conforms generally with the shape of cathode region 81 is buried in a first portion of the bottom portion of island region 41 beneath and contiguous with first cathode region 81. Similarly, a second, generally rectilinearly shaped, N+ semiconductor region 97 is buried in a second portion of the bottom of island region 41 beneath and contiguous with second cathode region 83. N+ region 97 is spaced apart from N+ region 95.

A third N-type semiconductor region 101 is disposed in island region 41 directly beneath and adjoining anode region 51. Region 101 has a first, generally octagonally shaped, annular portion 103, which defines a buried Zener junction 105 with anode region 51. Annular portion 103 extends to and is contiguous with the first buried N-type semiconductor region 95, such that a projection of the sense anode ohmic contact region 75 is effectively surrounded by annular portion 103 of the third buried N-type region. The diameter of this annular portion 103 of N-type buried region 101 is less than that of force anode, so that a first part 107 of the above-referenced ring-shaped portion 77 of anode region 51 lies between P+ sense anode ohmic contact region 75 and Zener junction 105, and a second part 109 lies between force anode 61 and Zener junction 105. As a result, the first part 107 of the ring-shaped portion 77 of anode region 51 will not be traversed by a current flow path between force anode 61 and Zener junction 105.

The third buried N-type region 101 also has a second, spaced apart portion 111 that extends from the annular, Zener junction-defining portion 103 and is contiguous with deep N+ buried region 97. Portion 111 comprises a generally rectilinear segment 113, which extends along bottom of anode region 51 and a vertically extending column region 115 that adjoins segment 113 and region 97, thereby completing a continuous N conductivity current flow path from Zener junction 105 to sense cathode 91. It should be noted that the N type semiconductor material of this second portion 111 of third buried region 101, buried region 97 and sense cathode region 83 occupies a portion of the Zener diode device that is spaced apart from force cathode region 81 and buried deep N+ region 95, so that it is not traversed by the current flow path from Zener junction 105 to force cathode 85.

Figure 1:
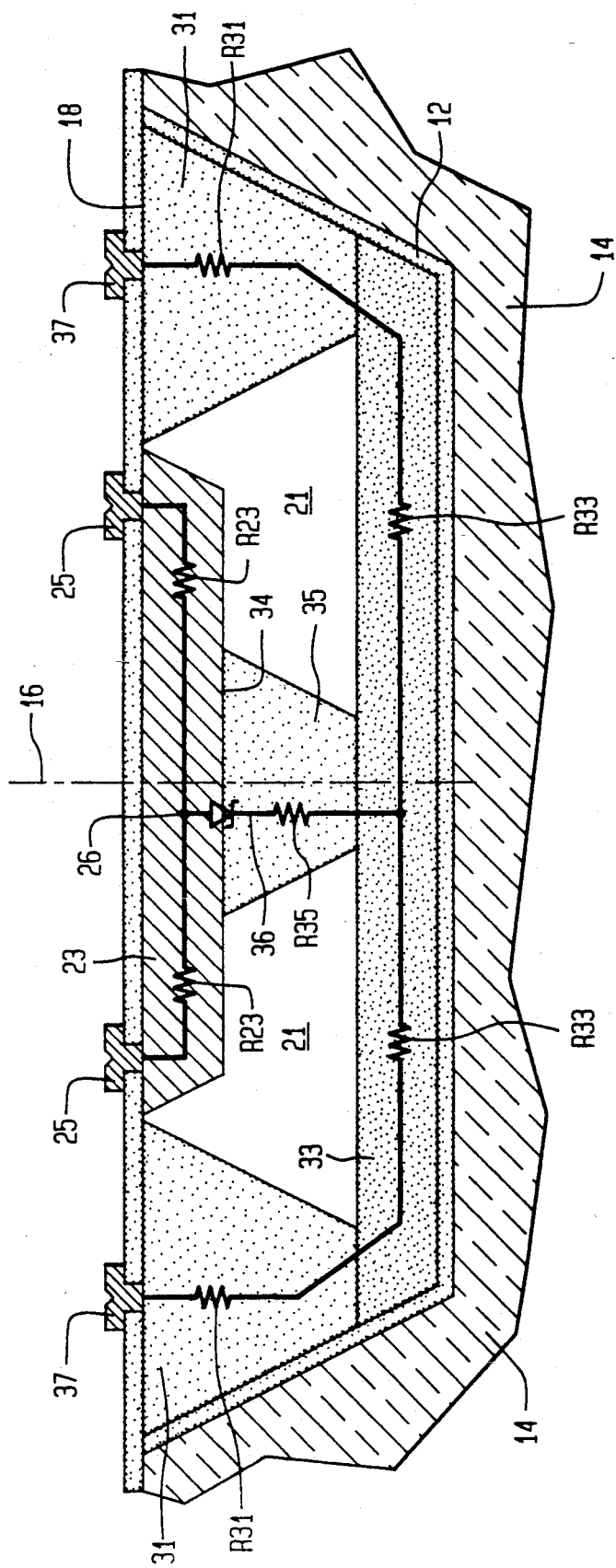
FIG. 1 diagrammatically illustrates, in cross-section, the configuration of a conventional buried Zener diode device formed in a dielectrically isolated island region of a semiconductor support substrate.
Figure 4:
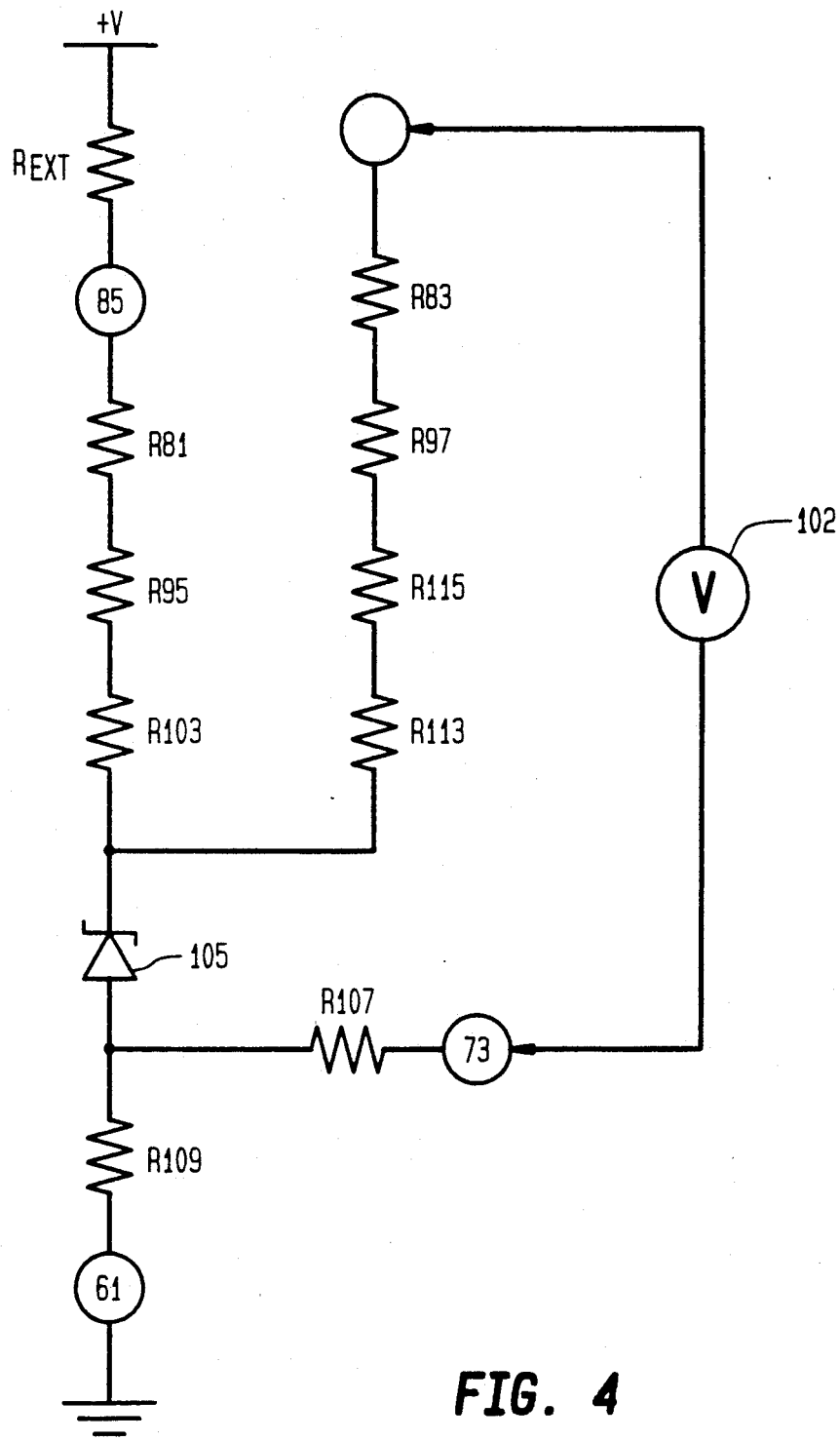
FIG. 4 is a schematic illustration of the force and sense current flow paths of the buried Zener diode device of FIGS. 2 and 3.

The operation and benefit provided by the auxiliary by-pass structure of the present invention may be readily understood with the aid of FIG. 4, which is a schematic illustration of the force and sense current flow paths of the buried Zener diode device of FIGS. 2 and 3. As in the prior art Zener diode device of FIG. 1 discussed previously, a typical application of the device as a voltage reference has force anode contact 61 and force cathode contact 85 coupled in a current flow path of a circuit, the operation of which requires monitoring the Zener junction voltage. Unlike the device of FIG. 1, however, the Zener voltage of junction 105 is not monitored by way of current flow path through the device between such force anode and cathode contacts. Rather, the Zener voltage is monitored by the auxiliary 'sense' anode and cathode contacts 73 and 91, respectively. As in the prior art illustration of FIG. 1, the resistances of the respective regions of FIGS. 2 and 3 are shown schematically therein and in FIG. 4 by resistance symbology associated with the respective regions and provided with same reference numerals as the regions, superseded by the letter R. For the force current path between force anode 61 and force cathode 85, there is a summed resistance value of (R109+R103+R95+R81) in series with the Zener junction voltage. The resistance R109 of the P+ semiconductor material of anode region 51 effectively masks the voltage at the true anode 66, while the accumulated value of resistances R103+R95+R81 of the N type semiconductor material of regions 103, 95 and 81, respectively effectively masks the voltage at the true cathode 76.

In the auxiliary access path the Zener junction by way of sense anode contact 73 and sense cathode contact 91, there is a summed resistance value of (R107+R113+R97+R83) in series with the Zener junction voltage. The resistance R107 of the P+ semiconductor material of the portion 107 of anode region 51 would normally effectively mask the voltage at the true anode 66, while the accumulated value of resistances R113+R97+R83 of the N type semiconductor material of regions 113, 97 and 83, respectively would normally mask the voltage at the true cathode 76. However, because the monitoring path from sense anode contact 73 and sense cathode contact 91 through resistance R107, Zener junction 105 and resistances R113, R97 and R83 encounters no current flow path that coincides with the current flow path between the force anode and cathode contacts 61 and 85, respectively, it is possible to use a high impedance sensing circuit to monitor Zener voltage by means of the sense anode and sense cathode contacts. Namely, connecting a high impedance device, such as an operational amplifier 120, to sense anode contact 73 and sense cathode contact 91 will not cause an appreciable current flow through regions of the Zener diode, so that there is no significant cumulative voltage drop across such regions. Thus, the Zener voltage may be monitored very precisely by way of the sense anode and sense cathode contacts, regardless of accumulated voltage drops through the regions that lie in a circuit path between force anode 61 and force cathode 85. Even where the values of resistances of regions auxiliary regions 107, 113, 115 and 83 that lie in the by-pass path between the sense anode and cathode terminals become quite large, (e.g. on the order of 15-30 ohms), or vary widely, so that the total resistance of these by-pass regions may vary over a substantial range, their effect on the Zener voltage measurement by way of the sense anode and sense cathode contacts is insignificant.

As will be appreciated from the foregoing description, the inaccuracy of Zener voltage measurements due to the unwanted influence of series resistance voltage drops in the regions of a buried Zener diode device is effectively obviated in accordance with the present invention by means of a new and improved buried Zener diode architecture having an auxiliary Zener junction access path in parallel with the main anode/cathode path through which current customarily flows during operation of the device. Unlike the main or force anode/cathode path, the auxiliary path is effectively by-passed by the current flowing between the main anode and cathode terminals during circuit operation, so that there is no accumulation of significant resistance-current products that would otherwise mask the Zener voltage.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A buried Zener diode device comprising:
   a body of semiconductor material;
   a first anode semiconductor region of a first conductivity type disposed in a first surface portion of said body;
   a first cathode semiconductor region of a second conductivity type disposed in a second surface portion of said body;
   a first buried semiconductor region of said second conductivity type buried in said body beneath and contiguous with said first cathode semiconductor region;
   a second cathode semiconductor region of said second conductivity disposed in a third surface portion of said body;
   a second buried semiconductor region of said second conductivity type buried in said body beneath and contiguous with said second cathode semiconductor region;
   a third buried semiconductor region of said second conductivity type disposed in said body beneath and contiguous with said first anode region and having a first portion defining a buried Zener junction with said first anode semiconductor region and extending to and contiguous with said first buried semiconductor region and a second portion extending to and contiguous with said second buried semiconductor region.

2. A buried Zener diode device according to claim 1, wherein said first portion of said third buried semiconductor region comprises a generally annular region portion extending between and contiguous with each of said first anode semiconductor region and said first buried semiconductor region, and wherein said device further comprises a second anode semiconductor region disposed in said first anode semiconductor region and generally surrounded by said first portion of said third buried semiconductor region.

3. A buried Zener diode device according to claim 1, further comprising a first anode contact disposed at a first surface portion of said first anode region, and wherein said first portion of said third buried semiconductor region is spaced-apart from said first surface portion of said first anode region, and wherein said device further comprises a second anode contact disposed at a second surface portion of said first anode semiconductor region.

4. A buried Zener diode device according to claim 3, further comprising a first cathode contact disposed on said first cathode semiconductor region and a second cathode contact disposed on said second cathode semiconductor region.

5. A buried Zener diode device comprising:
   a body of P-type semiconductor material;
   an anode semiconductor region disposed in a first surface portion of said body;
   a first anode contact ohmically coupled to a first portion of said anode semiconductor region;
   a second anode contact ohmically coupled to a second portion of said anode semiconductor region spaced apart from the first portion thereof;
   a first cathode semiconductor region disposed in a second surface portion of said body spaced apart from said first surface portion thereof;
   a first cathode contact ohmically coupled to said first cathode semiconductor region;
   a first buried semiconductor region of N conductivity type buried in said body beneath said second surface portion thereof and being contiguous with said first cathode semiconductor region;
   a second cathode semiconductor region of N conductivity disposed in a third surface portion of said body spaced apart from said first and second surface portions thereof;
   a second cathode contact ohmically coupled to said second cathode semiconductor region;
   a second buried semiconductor region of N conductivity type buried in said body beneath said third surface portion thereof and being contiguous with said second cathode semiconductor region;
   a third buried semiconductor region of N conductivity type disposed in said body beneath and contiguous with said first anode region and having a first portion defining a buried Zener junction with said first anode semiconductor region and extending to and being contiguous with said first buried semiconductor region, and a second portion extending to and being contiguous with said second buried semiconductor region.

6. A buried Zener diode device according to claim 5, wherein a second anode semiconductor region is disposed within said first anode semiconductor region so as to be spaced apart from said first portion of said third buried semiconductor region by a third portion of said anode semiconductor region therebetween, and wherein said first anode contact is spaced apart from said third buried semiconductor region by a fourth portion of said anode semiconductor region therebetween.

7. A buried Zener diode device according to claim 6, wherein said first portion of said third buried semiconductor region is generally annularly shaped, and wherein said second anode semiconductor region is disposed within said first anode semiconductor region so as to be spaced apart from said first portion of said third buried semiconductor region by a third, generally ring-shaped portion of said anode semiconductor region therebetween, and wherein said first anode contact is generally annularly shaped and is spaced apart from said third buried semiconductor region by a fourth, generally ring-shaped portion of said anode semiconductor region therebetween.

8. A buried Zener diode device according to claim 7, wherein said first cathode semiconductor region has a generally U-shaped configuration in plan, and wherein said anode semiconductor region has a segment that extends through an open end of said first cathode semiconductor region.

9. A buried Zener diode device according to claim 8, wherein said second portion of said third buried semiconductor region extends beneath said segment of said anode region which extends through said open end of said first cathode semiconductor region.

10. In a buried Zener semiconductor device having a semiconductor body, an anode region disposed in a first surface portion of said body, a main cathode region disposed in a second surface portion of said body, a buried Zener region contiguous with said cathode region and said anode region so as to form a buried Zener junction with said anode region, a main anode contact disposed at a first portion of said anode region, and a main cathode contact disposed at a first portion of said main cathode region, the improvement comprising an auxiliary anode contact disposed at a second portion of said anode region, an auxiliary cathode region disposed in a third surface portion of said body, an auxiliary cathode contact disposed on said auxiliary cathode region, and wherein said buried Zener junction is spaced-apart from said first and second portions of said anode region.

11. The improvement according to claim 10, wherein said main anode contact is disposed on said first portion of said anode semiconductor region so as to be spaced apart from a first portion of said buried Zener region by a third portion of said anode semiconductor region therebetween, and wherein said auxiliary anode contact is spaced apart from said first portion of said buried Zener region by a fourth portion of said anode semiconductor region therebetween.

12. The improvement according to claim 11, wherein said first portion of said buried Zener region is generally annularly shaped, and wherein said fourth portion of said anode semiconductor region is generally ring-shaped, so that said auxiliary anode contact is spaced apart from said first portion of said buried Zener region by said fourth generally ring-shaped portion of said anode semiconductor region therebetween, and wherein said main anode contact is generally annularly shaped and is spaced apart from said buried Zerer region by said third portion of said anode semiconductor region as a generally ring-shaped portion of said anode semiconductor region therebetween.

13. The improvement according to claim 12, wherein said main cathode semiconductor region has a generally U-shaped configuration in plan, and wherein said anode semiconductor region has a segment that extends through an open end of said main cathode semiconductor region.

* * * * *